United States Patent [19]

Russell

[11] Patent Number: 4,603,292

[45] Date of Patent: Jul. 29, 1986

[54] FREQUENCY AND TIME MEASUREMENT CIRCUIT

[75] Inventor: Robert J. Russell, South Boston, Mass.

[73] Assignee: Honeywell Information Systems Inc., Waltham, Mass.

[21] Appl. No.: 596,230

[22] Filed: Apr. 3, 1984

[51] Int. Cl.[4] ............................................. G01R 23/02
[52] U.S. Cl. .................................... 324/78 R; 368/120
[58] Field of Search ................. 324/77 H, 77 R, 77 B, 324/77 D, 78 R, 78 D, 78 Z, 79 R, 79 D, 83 R; 455/154, 157; 343/17.7, 18 E; 368/115, 117, 118, 120

[56] References Cited

U.S. PATENT DOCUMENTS

| | | | |
|---|---|---|---|
| 4,011,502 | 3/1977 | Fraser | 368/120 |
| 4,310,891 | 1/1982 | Niki | 455/157 |
| 4,336,541 | 1/1982 | Tsui | 343/18 E |
| 4,426,648 | 1/1984 | Tsui | 324/79 R |
| 4,433,919 | 2/1984 | Hoppe | 368/120 |
| 4,439,046 | 3/1984 | Hoppe | 368/120 |
| 4,547,727 | 10/1985 | Tsui | 324/79 D |

Primary Examiner—Michael J. Tokar

[57] ABSTRACT

A frequency and time measurement circuit is provided with a delay means for effectively delaying the leading edge of a pulse. A register is clocked by the trailing edge of the pulse to take a snapshot of how far the leading edge of the pulse has progressed through the delay means. During a calibration phase, a reference pulse of constant length is used to take a reference reading. During a measurement phase, the measurement reading is taken on the unknown pulse whose clock frequency or time period is to be determined. By comparing the reference reading with the measurement reading, the relative clock frequency or time of the unknown pulse can be determined.

28 Claims, 5 Drawing Figures

FREQUENCY AND TIME MEASUREMENT CIRCUIT

BACKGROUND OF THE INVENTION

1. Field of the Invention

This invention relates to a method and apparatus for measuring frequency or time and more specifically to measuring the frequency of electronic signals or the time period between the occurrence of electronic signals by comparison to a reference frequency or time period.

2. Description of the Prior Art

During the manufacturing or maintenance of an electronic device it is often necessary to adjust the time periods or frequencies of various electronic components contained within the electronic device. For example, during the manufacture of a computer, it may be necessary to adjust the time period of retriggerable monostable multivibrators or voltage controlled oscillators. In adjusting such devices, it is often desirable to be able to time a one microsecond pulse to be plus or minus ten nanoseconds.

There are several known methods which can be used to time the period of the pulse or to determine the frequency of the oscillator. One method employs a crystal oscillator and consists of counting the number of oscillations made by the output of the crystal oscillator during the period to be timed. The disadvantage of this method of counting the number of pulses or the number of oscillations from a crystal oscillator is that a very fast crystal oscillator must be used with a correspondingly fast counter if a fine resolution is desired. For example, in order to achieve a resolution of plus or minus five nanoseconds, a 200 megahertz crystal oscillator would be required.

The second method involves use of a retriggerable monostable multivibrator, also known as a one shot, as a reference and to compare its time period against the time period or frequency of the electronic component that is being measured. The disadvantage of this technique is that the pulse period of the reference one shot may drift over time. It is, therefore, not a reliable long term standard. The drift of the calibration one shot can result in electronic devices being shipped to customers with improper internal time period adjustments. This slow drift of the one shot calibration standard can, therefore, result in serious problems in maintenance of equipment. For example, if a one shot is originally adjusted to have a 1000 nanosecond time period and is used as a standard to adjust other one shots to a 1000 nanosecond time period, plus or minus 30 nanoseconds, but the one shot calibration standard drifts over time and produces a period of 1020 nanoseconds, the components being measured are adjusted to be within plus or minus 30 nanoseconds of that incorrect standard, which can result in devices being shipped which have one shots with time periods adjusted to be as much as 1050 nanoseconds. These out of tolerance components may cause failures of overall systems. Such failures may go unnoticed initially when the system is installed and become apparent only during usage on a hot day when the time period may further drift to become, for example, 1052 nanoseconds.

Another problem that is often encountered with time or frequency measurement instruments is that, besides being expensive, the instrument itself is necessarily relatively large and it may, therefore, be very difficult to position the instrument in close proximity to the component generating the time period or frequency which is to be measured. This is especially true in the case of automatic test equipment where the frequency or time measurement instrument is but a subordinate, or even optional, part of a larger system. Having the time or frequency measurement instrument in close proximity to the source of the frequency or time period that is to be measured has the advantage that the measurement can be made more accurately. A further disadvantage of some time or frequency measurement instruments is that many of these require that the time period being measured be repeated such that if it is desired to measure the period of a one shot, the one shot must be triggered many times and the time period is determined by an averaging method.

Therefore, what is desirable is to have an instrument that can be used to measure frequency or time periods that is relatively low in cost, that is relatively small in size and that has a relatively fine resolution and whose accuracy will not significantly drift over time.

OBJECTS OF THE INVENTION

Accordingly, it is an object of the present invention to provide a frequency or time measurement circuit that has high resolution.

It is another object of the present invention to provide a frequency or time measurement circuit whose accuracy will not sufficiently drift over time.

It is a further object of the present invention to provide a frequency or time measurement circuit that is compact in size.

It is a yet further object of the present invention to provide a frequency or time measurement circuit that is low in cost.

This invention is pointed out with particularity in the appended claims. An understanding of the above and further objects and advantages of this invention can be obtained by referring to the following description taken in conjunction with the drawings.

SUMMARY OF THE INVENTION

A frequency and time measurement circuit for use in the manufacture or maintenance of electronic assemblies is provided with a delay means for effectively delaying the leading edge of a pulse. A register is clocked by the trailing edge of the pulse to take a snapshot of how far the leading edge of the pulse has progressed through the delay means. During a calibration phase, the reference pulse of constant length is used to take a reference reading. During a measurement phase, the measurement reading is taken on the unknown pulse whose clock frequency or time period is to be determined. By comparing the reference reading with the measurement reading, the relative clock frequency or time of the unknown pulse can be determined. If the unknown pulse is generated by a single pulse source, a first multiplexer is provided to select between the reference pulse and the unknown pulse. The reference pulse is obtained by single pulse logic which creates a pulse equal in length to one or more cycles. If the unknown pulse is generated by a multiple pulse source, the single pulse logic can be used to generate the unknown pulse by providing a second multiplexer to select whether the output of the multiple pulse source or the reference oscillator is provided as input to the single pulse logic.

BRIEF DESCRIPTION OF THE DRAWINGS

The manner in which the method of the present invention is performed and the manner in which the apparatus of the present invention is constructed and its mode of operation can best be understood in light of the following detailed description together with the accompanying drawings in which like reference numbers identify like elements in the several figures and in which.

DESCRIPTION OF THE PREFERRED EMBODIMENT

Descriptive Conventions

In the system of the invention, electrical signals representing the binary ONE (high) state and the binary ZERO (low) state are applied to and obtained from various logic gates or other circuit elements. For the sake of brevity, the signal names are sometimes used to label the lines connecting the various logic gates and circuit elements.

For the sake of simplicity, logic gates are referred to as AND, OR, NAND and NOR gates, the difference between an AND gate and a NAND gate being that the NAND gates has an inverter, designated by a little circle in drawing, on its output line.

It is also assumed, for purposes of illustration, that logic requiring positive inputs for a positive output is employed unless indicated otherwise. That is, the logic circuits such as AND and OR circuits, for example, are operated by high signal levels at the input to produce a high level signal at the output. Logic levels which are not high will be termed low.

Test System Overview

Figure 1:
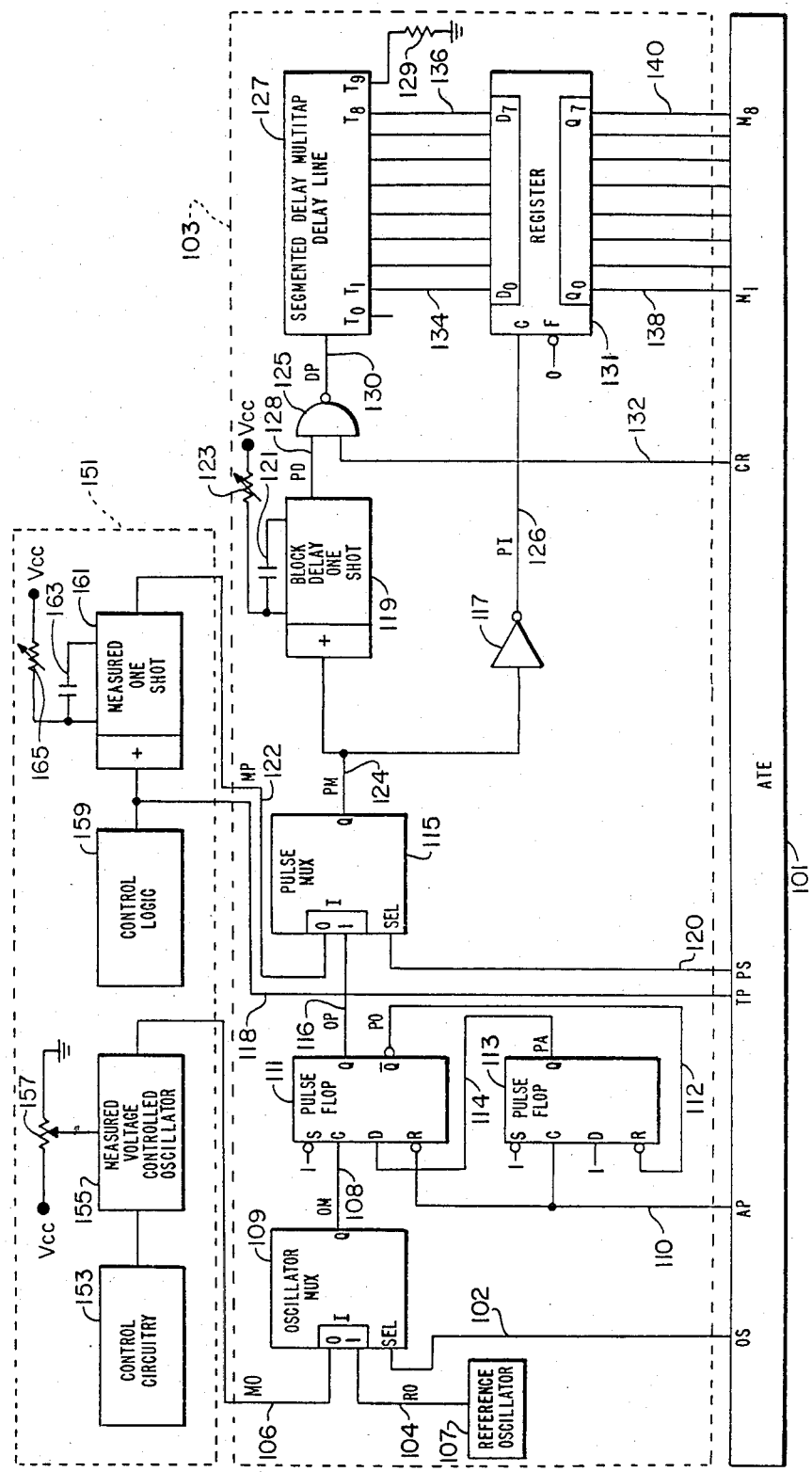
FIG. 1 illustrates the logic of the frequency or time measurement circuit of the present invention, an example unit under test and the automatic test equipment used to control the measurement circuit.

A logic diagram of the frequency or time measurement circuit of the preferred embodiment is shown in FIG. 1. The frequency or time measurement circuit is shown as block 103 in FIG. 1, an example unit under test having both a single pulse and a multi-pulse generator is shown as block 151 and an automatic test equipment which controls the testing of the unit under test 151 by the measurement circuit 103 is shown as block 101.

In the preferred embodiment, automatic test equipment 101 is a Fairchild 303 Faultfinder, manufactured by Fairchild Test Systems Group of Latham, N.Y., which is a programmable in-circuit tester which has a bed of nails fixture used to make electrical contact between the automatic test equipment 101 and the unit under test 151. In the preferred embodiment, measurement circuit 103 is contained within the bed of nails fixture of the automatic test equipment 101 such that the measurement circuit 103 is in very close proximity to the unit under test 151. The preferred embodiment frequency or time measurement circuit 103 is constructed such that it can be used to adjust the frequency of a single pulse source in the unit under test 151, depicted in FIG. 1 as measured one shot of retriggerable monostable multivibrator 161, or it can be used to adjust the pulse length of a multi-pulse source, depicted in FIG. 1 as measured voltage controlled oscillator 155. In the example unit under test 151 of FIG. 1, measured one shot 161 is normally triggered by control logic 159 and measured voltage controlled oscillator 155 is controlled by control circuitry 153.

FIG. 1 shows that for the example unit under test 151 there are three lines which connect the unit test 151 with measurement circuit 105. These lines are: line 106 which carries signal MO from measured voltage controlled oscillator 155 to oscillator multiplexer 109; line 118 which carries signal TP from automatic test equipment 101 to the input of measured one shot 161 so that the automatic test equipment can control the triggering of measured one shot 161 in lieu of control logic 159; and line 122 which carries the single pulse signal MP from measured one shot 161 to pulse multiplexer 115. These three lines 106, 118 and 122 would be connected via three pins of the bed of nails fixture making contact with the unit under test 151. In addition, there would be other pins making contact with unit under test 151 to supply ground and various other voltages, such as voltage VCC, which is shown in FIG. 1.

Measurement Circuit

The operation of the frequency or time mesurement circuit of the invention is relatively simple. During a calibration phase, the measurement circuit is calibrated by use of a reference pulse having the desired frequency or time duration and a reference reading is taken. The calibration phase is followed by a measurement or adjustment phase during which the unknown pulse is measured and a reading taken and the reference reading is then compared with the measurement reading of the unknown pulse. The differences between the reference reading and the measurement reading can then be used to adjust the unknown pulse length if desired. Both the reference reading and the measurement reading are made using a multiple tap delay line to delay the trailing edge of the pulse generated by block delay one shot 119, which fired at the leading edge of the pulse whose duration is to be read and by using the trailing edge of the pulse whose duration is to be read to clock a register which will snapshot how far down the multiple tap delay line the trailing edge of the block delay one shot 119 has progressed. By comparing the contents of the register when the reference reading is taken with the contents of the register when the measurement reading is taken, it can be determined whether the unknown pulse is longer or shorter in duration (or a lower or higher frequency) than the reference pulse.

The operation of the frequency and time measurement will now be described in detail with reference to FIG. 1. As described above, the measurement circuit 103 has the ability to measure the period or frequency of either a multiple pulse source or a single pulse source. Therefore, in FIG. 1 the unit under test 151 is illustrated as having both a multiple pulse source such as measured voltage controlled oscillator 155 and a single pulse source such as measured one shot 161. In the example unit under test 151, measured voltage controlled oscillator 155 may be adjusted to have a nominal frequency by changing the setting on potentiometer 157, which has one input connected to supply voltage VCC and the other input connected to ground. Similarly, measured one shot 161 can have its delay period adjusted by changing the value of capacitor 163 or variable resistor 165 which is also connected to the supply voltage VCC.

For illustrative purposes, assume that unit under test 151 is to be adjusted such that the measured voltage controlled oscillator 155 will have a nominal one megahertz frequency and that measured one shot 161 is to produce a one microsecond (1000 nanosecond) pulse in response to being triggered by a rising pulse at its input which is connected to the automatic test equipment 101 by line 118. The pulse output by measured one shot 161 appears on line 122 which is connected to the measurement circuit 103.

As will be seen below, measurement circuit 103 must have values selected for: reference oscillator 107; block delay one shot 119; and segmented delay multitap delay line 127 which corresponds to the values of the multiple pulse source and single pulse source of unit under test 151. The frequency of reference oscillator 107 must correspond to the desired frequency of the multiple pulse source of unit under test 151. In an example case, assume it is desired to adjust measured voltage controlled oscillator 155 to have a one megahertz frequency, reference oscillator 107 must be a very stable one megahertz oscillator and in the preferred embodiment a crystal oscillator is used.

The reference oscillator 107 must also have a frequency which corresponds to the time delay period of the single pulse source in unit under test 151. In the example case, assume measured one shot 161 is to produce a one microsecond pulse and therefore the frequency of reference oscillator 107 is to be one megahertz so that a single reference oscillator can be used when adjusting either measured voltage controlled oscillator 155 or measured one shot 161. If the frequency and the delay period of the multiple pulse source and the single pulse source were not compatible, then multiple reference oscillators would be required and oscillator multiplexer 109 would be used to select the proper reference oscillator depending upon whether the measured voltage controlled oscillator 155 was being measured or whether the measured one shot 161 was being measured. If multiple reference oscillators were to be used, in addition to having oscillator multiplexer 109 select the appropriate reference oscillator, multiple block delay one shots 119 may be required, depending upon the amount of delay in segmented delay multitap delay line 127. If multiple block delay one shots 119 are used, all their trigger inputs would be connected to line 124 and their outputs would be connected to a multiplexer which would selectively gate the output of one block delay one shot onto line 128 as input into NAND gate 125. The selected block delay one shot would have a time period slightly shorter than the period of the selected reference oscillator.

In the example unit under test, a single reference oscillator 107 having a one megahertz frequency will suffice to measure both the multiple pulse source 155 and the single pulse source 161. Therefore, oscillator multiplexer 109 is a 2 to 1 multiplexer which can be used to select between reference oscillator 107 or measured voltage controlled oscillator 155 under the control of oscillator source signal OS from automatic test equipment 101 which is connected to the select (SEL) input of oscillator multiplexer 109. When signal OS is a binary ZERO, signal MO on line 106 from measured voltage controlled oscillator 155 will be gated onto the Q output of oscillator multiplexer and when signal OS is a binary ONE, signal RO on line 104 from reference oscillator 107 will be gated to the Q output of oscillator multiplexer 109 as signal OM on line 108.

Pulse flop 111 and pulse flop 113 are connected to receive the output of oscillator multiplexer 109 and to allow a single positive pulse to be output on the Q output of pulse flop 111 on line 116 as signal OP under the control of signal AP on line 110 from automatic test equipment 101. Pulse flop 111 and pulse flop 113 are D-type positive-edge-triggered flip-flops with preset and clear inputs and are clocked by a positive going signal at their clock (C) input which clocks the signal appearing at their data (D) input onto their Q output and the data input signal inverted onto their Q-bar output. By connecting the Q-bar output signal PO of pulse flop 111 on line 112 to the reset (R) input of pulse flop 113 and the Q output signal PA of pulse flop 113 on line 114 to the data (D) input of pulse flop 111 and clocking pulse flop 111 with the multiple pulse signal which appears as signal OM on line 108, the output signal OP on line 116 will be a single positive going one microsecond pulse produced after control signal AP from automatic test equipment 101 goes to the binary ONE state.

When signal AP on line 110 transitions from the binary ZERO to the binary ONE state, it clocks pulse flop 113 which will set pulse flop 113 and cause its output, signal PA on line 114, to become a binary ONE. Thus, the next time a positive going signal appears on line 108, pulse flop 111 will be set causing its Q output, signal OP on line 116, to transition from the binary ZERO to the binary ONE state and also cause its Q-bar signal PO on line 112 to transition from the binary ONE to the binary ZERO state thereby resetting pulse flop 113 and causing its Q output, signal PA on line 114, to return to the binary ZERO state such that the next time a positive going signal appears on line 108, pulse flop 111 will be reset causing its output signal OP to return to the binary ZERO state. Signal AP on line 110 prevents a positive going signal OM on line 108 from clocking pulse flop 111 prematurely by holding its reset (R) input in the binary ZERO state until such time as the pulse is to be allowed. The set (S) inputs of pulse flop 111 and pulse flop 113 are set to a binary ONE such that they are not used to preset the pulse flops 111 and 113.

Pulse multiplexer 115 is used to select between the signal OP on line 116 at one input and the single pulse signal from the unit under test 151, signal MP on line 122, at the other input under the control of signal PS at the select (SEL) input. If signal PS on line 120 from automatic test equipment 101 is in the binary ZERO state, signal MP on line 122 will be gated to the Q output of pulse multiplexer 115 and if signal PS on line 120 is in the binary ONE state, signal OP on line 116 will be gated to the Q output of pulse multiexer 115 as signal PM on line 124. The output of pulse multiplexer 115, signal PM on line 124, is used to trigger block delay one shot 119, the delay period of which can be adjusted by changing the value of capacitor 121 and variable resistor 123. Signal PM is also inverted by inverter 117 to produce signal PI on line 126.

The output of block delay one shot 119, signal PD on line 128, is one input of NAND gate 125, which in the preferred embodiment is a 50 ohm line driver type NAND gate having sufficient power to drive multiple tap delay line 127. The other input of NAND gate 125 is signal CR on line 132 which allows automatic test equipment 101 to control the output of NAND gate 125, signal PD on line 130. When signal CR from automatic test equipment 101 is in the binary ZERO state, the output signal PD on line 130 will be in the binary ONE state and when signal CR is in the binary ONE state, the output of NAND gate 125 will be controlled by input signal PD on line 128. As will be seen below, signal CR is used during the calibration phase of the measurement circuit 103 to allow register 131 to be preset to all binary ONEs, thus making it possible to detect the case in which a falling trailing edge does not appear on line 124 as might occur if a measured one shot 161 or a measured voltage controlled oscillator 155 had been omitted in the assembly of unit under test 151. The absence of a falling trailing edge will result in register 131 not being clocked, which in turn will result in signals M1 through M8 remaining unchanged from the previous time register 131 was clocked.

Segmented delay multitap delay line 127 is a multiple tap delay line which in the preferred embodiment has ten taps, T0 through T9, each of which receives a signal at its output a predefined period of time after the signal has appeared at its input on line 130. For example, in the preferred embodiment, T0 receives the signal 5 nanoseconds after it has appeared at the input, T1 receives the signal 10 nanoseconds after it has appeared at the input, T2 receives the signal 15 nanoseconds after it appears at the input and so on such that T8 receives signal 45 nanoseconds after it appears at the input and T9 receives the signal 50 nanoseconds after it appears at the input. As can be seen in FIG. 1, tap T0 is not used and tap T9 is connected only to ground via termination resistor 129.

Taps T1 through T8 are respectively connected to inputs D0 through D7 of register 131 which has the D0 through D7 inputs gated to the Q outputs Q0 through Q7 respectively when the clocking signal PI on line 126 transitions from the binary ZERO to the binary ONE state. The output enable (F) input of register 131 is connected to a binary ZERO such that the outputs of register 131 are always enabled. Signal PM on line 124 is inverted by inverter 117 to produce signal PI on line 126 which is used to clock register 131. The Q0 through Q7 outputs of register 131 on lines 138 through 140 provide signals M1 through M8 respectively which are inputs to automatic test equipment 101 so that automatic test equipment 101 can read the eight outputs of register 131.

In the preferred embodiment, block delay one shot 119 is a type 9602 one shot, manufactured by Fairchild, and is adjusted to have a value of approximately 975 nanoseconds by proper choice of the values of capacitor 121 and adjusting variable resistor 123. segmented delay multitap delay line 127 is a multiple tap delay line of the type 124040P, manufactured by PCA Electronics of Sepulveda, Calif., and was chosen such that the resolution between successive taps is 5 nanoseconds so that the time periods of the components on the unit under test 151 will be able to be adjusted in 5 nanoseconds increments.

The total delay between the input to block delay one shot 119 and the middle tap of segmented delay multitap delay line 127 is chosen to equal the desired value of the period of the single pulse source, which in the example unit under test 151 is measured one shot 161 or the delay corresponding to the frequency of the multiple pulse source which in the example unit under test 151 is measured voltage controlled oscillator 155. By choosing the values of block delay one shot 119 and segmented delay multitap delay line 127 in this manner, when the measurement circuit 103 is calibrated during the calibration phase using reference oscillator 107, the trailing edge of the reference pulse will have progressed to the middle tap of segmented delay multitap delay line 127 when register 131 is clocked, thus allowing earlier and later taps to detect misadjustments in the trailing edge of the measured pulse during the adjustment phase.

The adjustment of block delay one shot 119 is performed by performing a calibration phase on measurement circuit 103 and adjusting variable resistor 123 such that the trailing edge of the pulse signal it produces will have progressed to just past the middle tap, which in this case is tap T4, when register 131 is clocked by the trailing edge of the reference pulse which occurs on line OP from pulse flop 11. This adjustment of block delay one shot 119 is done by doing repetitive calibrations and adjusting variable resistor 123 until signals M1 through M4 are binary ONEs and signals M5 through M8 are binary ZEROs.

The method by which the frequency or time measurement circuit 103 is employed to measure frequency or time will now be described with reference to the timing diagram of FIG. 2 and the flow charts of FIGS. 3, 4 and 5. As will be seen, the performance of a frequency or time measurement consists of a calibration phase in which reference oscillator 107 is used to supply a known frequency or time period and a single pulse is allowed to trigger block delay one shot 119 and the resultant pulse pass into segmented delay multitap delay line 127 before the signals at the various tap outputs are clocked into register 131 to get a calibrated reference reading of signals M1 through M8. This calibration phase is then immediately followed by a measurement phase in which a single pulse from the unit under test 151 triggers block delay one shot 119 and the resultant pulse passes into segmented delay multitap delay line 127 and the signals at the various tap outputs indicating the progress of the pulse are then clocked into register 131 and the measurement reading of signals M1 through M8 from the unit under test pulse is then compared with the calibration reading of signals M1 through M8.

Figure 2:
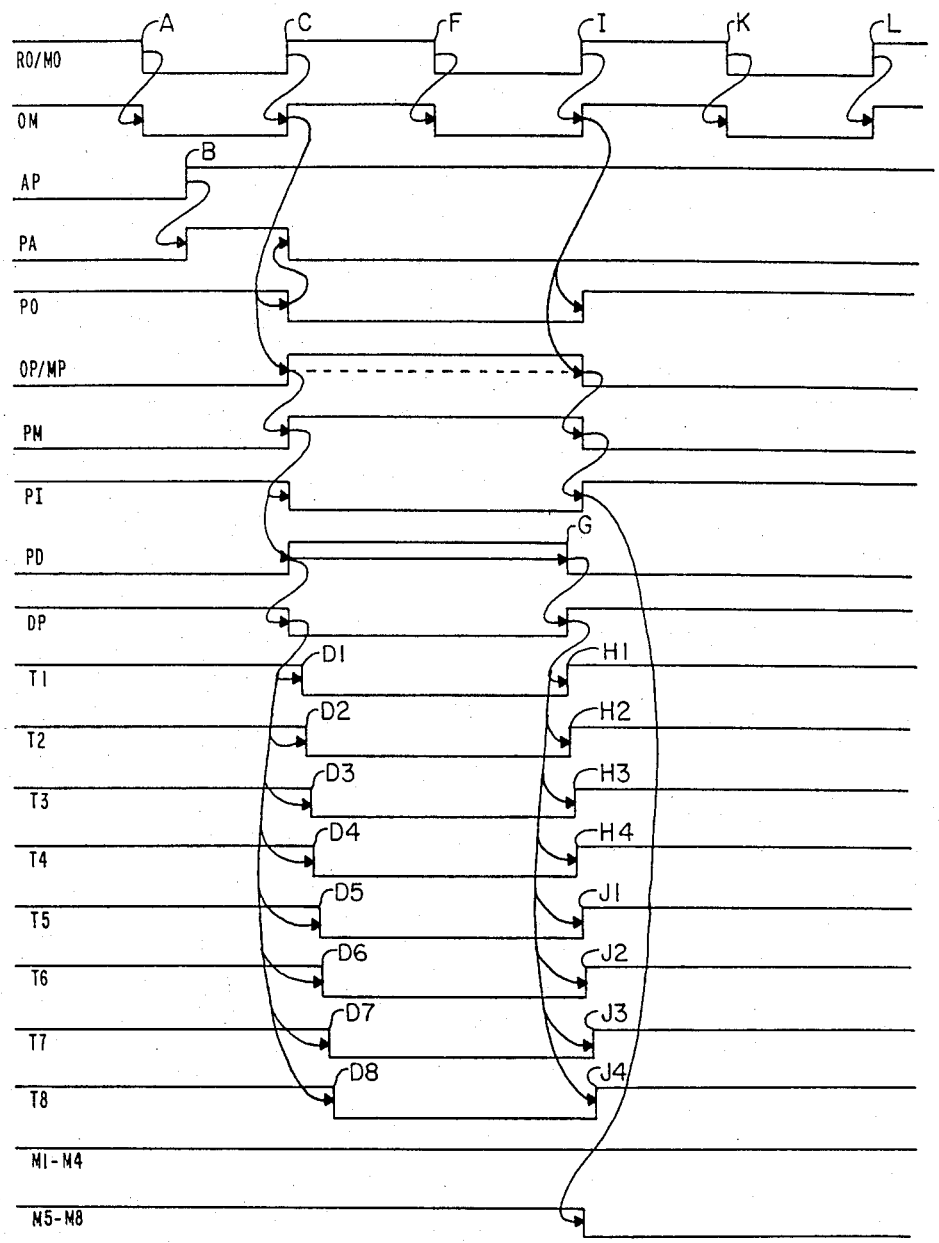
FIG. 2 illustrates the timing diagram of the signals from the frequency or time measurement circuit of FIG. 1.

FIG. 2 illustrates the wave forms of the various signals shown in FIG. 1. The top waveform illustrates signal RO from reference oscillator 107, or it may represent M0 from measured voltage controlled oscillator 155. Signal RO goes from the binary ONE state to the binary ZERO state at time A, and from the binary ZERO state to the binary ONE of time C, and again from the binary ONE state to the binary ZERO state at time F returning fom the binary ZERO state to the binary ONE state at time I, and so on. In the example discussed above, if reference oscillator 107 is a one megahertz crystal controlled oscillator, the time between time A and time C will be a nominal 500 nanoseconds and the time between time C and time F will be such that the total time for one complete cycle from time A to time F or from time F to time K will be one microsecond. The second signal in FIG. 2, signal OM, is the output of oscillator multiplexer 109 and follows the input signal such that it transitions from the binary ONE state to the binary ZERO state at time A and from the binary ZERO state to the binary ONE state at time C and so on as does the input signal RO if the output of reference oscillator 107 is selected or signal MO if the output of measured voltage controlled oscillator 155 is selected under the control of signal OS at the select (SEL) input of oscillator multiplexer 109.

In FIG. 2, it should be noted that the switching delays within the various logic elements, such as oscillator multiplexer 109, pulse flop 111, pulse flop 113 or NAND gate 125 are ignored and are considered to be negligible. These various propagation delays within the various logic elements, excluding the delays of block delay one shot 119 and segmented delay multitap delay line 127, can be ignored so long as the delay is relatively constant so that they will be the same during the calibration phase and measurement phase and therefore effectively cancel each other out. The third signal in FIG. 2 is the pulse control signal AP which comes from automatic test equipment 101 to allow one of the pulses from pulse flop 111 to progress to the delays 119 and 127 and register 131. Signal AP is shown as going from the binary ZERO to the binary ONE state at time B so that thereafter the next rising edge of signal OM will start a pulse and then the next rising edge of signal OM after the starting rising edge will terminate the pulse. In FIG. 2, the first rising edge of signal OM occurs at time C and the next rising edge occurs at time I such that time C will start the pulse and time I will terminate the pulse.

At time B, signal PA transitions from the binary ZERO state to the binary ONE state in response to signal AP clocking pulse flop 113. At time C, the rising edge of signal OM causes pulse flop 11 to be clocked which causes signal PO at its Q-bar output to transition from the binary ONE to the binary ZERO state because the data (D) input of pulse flop 111 is a binary ONE and also causes the Q output signal OP to transition from the binary ZERO to the binary ONE state. Signal OP, which is output from pulse flop 11, causes the output of pulse multiplexer 115, signal PM, to transition from the binary ZERO state to the binary ONE state at time C. Signal PM which is input to inverter 117 causes its output, signal PI, to transition from the binary ONE to the binary ZERO state at time C. At time C, when signal PM transitions from the binary ZERO to the binary ONE state it will trigger block delay one shot 119 and cause its output, signal PD on line 128, to transition from the binary ZERO to the binary ONE state. This transition of signal PD from the binary ZERO to the binary ONE state at time C causes the output of NAND gate 125, signal DP on line 130, to transition from the binary ONE to the binary ZERO state, assuming signal CR is a binary ONE. The transition of signal PD at time C causes the output of NAND gate 125, signal DP, to transition from the binary ONE to the binary ZERO state. This transition of signal DP, which is the input signal to segmented delay multitap delay line 127, propagates down the delay line 127 arriving at tap T1 at time D1, T2 at time D2, T3 and time D3, T4 at time D4, T5 at time D5, T6 at time D6, T7 at time D7, and T8 at time D8 and causes the corresponding signals, T1 through T8, to transition from the binary ONE to the binary ZERO state at the respective times. After time C and before time G, signal RO and signal OM transition from the binary ONE state to the binary ZERO state at time F but this does not affect the state of any other signal shown in FIG. 2.

At time G, the output of block delay one shot 119 transitions from the binary ONE state to the binary ZERO state, in the example being discussed block delay one shot 119 has been adjusted to have a delay period of approximately 975 nanoseconds, and therefore time G will occur this 975 nanoseconds after time C.

At time I, signal RO transitions from the binary ZERO to the binary ONE state and causes signal OM to also transition from the binary ZERO state to the binary ONE state. At time I, the transition of signal OM from the binary ZERO to the binary ONE state clocks pulse flop 111 which at time I has a binary ZERO at its data (D) input because signal PA is in the binary ZERO state and therefore causes the Q-bar output of pulse flop 111, signal PO, to transition from the binary ZERO to the binary ONE state and causes the Q output, signal OP, to transition from the binary ONE state to the binary ZERO state. The transition of signal OP from the binary ONE state to the binary ZERO state causes the output of pulse multiplexer 115, signal PM, to transition from the binary ONE to the binary ZERO state at time I and this transition of signal PM causes signal PI to transition from the binary ZERO state to the binary ONE state. When signal PI transitions from the binary ZERO state to the binary ONE state at time I, it clocks registers 131 thereby capturing the current state of taps 1 through 8 of segmented delay multitap delay line 127. At time I, the state of the various taps of segmented delay multitap delay line 127 will have signals T1, T2, T3 and T4 in the binary ONE state and signals T5, T6, T7 and T8 in the binary ZERO state.

At time H1, which is 10 nanoseconds after time G, as determined by the delay between the input and tap T1 of segmented delay multitap delay line 127 signal T1 will transition from the binary ZERO state to the binary ONE state as the trailing edge of signal DP progresses through segmented delay multitap delay line 127. Five nanoseconds after time H1, which is 15 nanoseconds after time G, signal T2 will transition from the binary ONE to the binary ZERO state at time H2. Five nanoseconds after time H2, at time H3, signal T3 will transition to the binary ZERO to the binary ONE state. Five nanoseconds after time H3, signal T4 transitions from the binary ZERO to the binary ONE state. Five nanoseconds after T4 transitions, T5 will transition at time J1. Five nanoseconds after time J1, signal T6 will transition at time J2 and five nanoseconds after time J2, signal T7 will transition at time J3 and five nanoseconds after time J3, signal T8 will transition at time J4. Therefore, at time I, which occurs between times H4 and J1, signals T1 through T4 will have transitioned to the binary ONE state and signals T5 through T8 will still be in the binary ZERO state such that when register 131 is clocked, signals M1 through M4 will be set to the binary ONE state and signals M5 through M8, which correspond to signals T5 through T8 will be in the binary ZERO state.

Calibration Phase

The calibration phase during which a reference reading is developed in register 131 will now be described with respect to FIG. 3. The various blocks in FIG. 3 represent operations performed by automatic test equipment 101 to condition the signals which control the operation of frequency or time measurement circuit 103. The calibration operation starts in block 301. In block 303, signal OS is set to the binary ONE state so that the output of oscillator multiplexer 109 will be the reference timing signal generated by reference oscillator 107. In block 305, signal AP is set to the binary ZERO state so that when the signal it transitions to the opposite state, which is the binary ONE state, it will enable pulse flop 111 and pulse flop 113 to generate one pulse. In block 307, signal PS is set to the binary ONE state so that signal OP at the input of phase multiplexer 115 will be gated to the Q output as signal PM. In block 309, signal CR is set to the binary ONE state to enable the output of NAND gate 125 to be controlled by the input signal PD.

In block 311, signal AP is set to the binary ONE state thereby clocking pulse flop 113 and enabling pulse flop 111 so that pulse flop 111 will be clocked by the next transition of signal OM from the binary ZERO to the binary ONE state. After signal AP is set to the binary ONE state in block 311, the first transition of signal OM from the binary ZERO to the binary ONE state will result in signal OP at the output of pulse flop 111 transitioning from the binary ZERO to the binary ONE state and the second transition of signal OM from the binary ZERO to the binary ONE state will result in signal OP transitioning from the binary ONE to the binary ZERO state. The transition of signal OP from the binary ZERO to the binary ONE state is the leading edge of the pulse which will trigger block delay one shot 119 and cause signal PD to transition to the binary ONE state. After approximately 975 nanoseconds, signal PD transitions from the binary ONE to the binary ZERO state and this transition will propagate through segmented delay multitap delay line 127 and appear at taps T1 through T8 at 5 nanosecond intervals.

When signal OP transitions from the binary ONE state to the binary ZERO state in response to the second transition of signal OM from the binary ZERO to the binary ONE state, signal PI will transition from the binary ZERO state to the binary ONE state and clock register 131. This transition of signal PI occurs at the trailing edge of the positive pulse that appears as signal PM and thereby allows the trailing edge of that signal pulse to capture the propagation of the trailing edge of the single shorter pulse propagating through segmented delay multitap delay line 127. In block 313, after register 131 has been clocked by the trailing edge of signal PM, automatic test equipment 101 reads the outputs of register 131 as signals M1 through M8 and stores the state of these signals as a reference value to be compared with the measured value which will be measured in a next phase of the operation.

In block 315, signal CR is set to the binary ZERO state thereby disabling NAND gate 125 and assuring that signal DP will be a binary ONE which will propagate through segmented delay multitap delay line 127 and appear on all output signals T1 through T8. In block 317, after signal DP has had time to propagate past tap T8, signal AP is set to the binary ZERO state, so that when it next transitions to the binary ONE state, signal AP will enable one pulse to be generate by pulse flops 111 and 113. In block 319, signal AP is set to the binary ONE state thereby clocking pulse flop 113 and enabling pulse flop 111 to be clocked by the next occurrence of signal OM transitioning from the binary ZERO to the binary ONE state. In block 321, register 131 is read after the trailing edge of the signal of single pulse PM has clocked register 131. When register 131 is read in block 321, signals M1 through M8 should all be in the binary ONE state because the binary ONE signal produced at the output of NAND gate 125 will have had more than 50 nanoseconds to completely propagate through segmented delay multitap delay line 127 because the trailing edge of the pulse of signal PM will have occurred 1,000 nanoseconds after the leading edge which occurred only after signal AP was set to the binary ONE state in block 319.

This setting of register 131 so that signals M1 through M8 all are binary ONEs is desired in that if measured one shot 161 or measured voltage controlled oscillator 155 is not present within unit under test 151, no transition of signal PM from the binary ONE state to the binary ZERO state will have occurred to clock register 131. If register 131 is not clocked during the measurement phase, it will continue to have its output signals M1 through M8 remain in the binary ONE state and this will indicate that the measured frequency or time period is not the same as the previous calibration reference reading stored in block 313. Block 321 exits to block 323 which is the end of the calibration phase and allows the next measurement phase, also called the adjustment phase, to begin. If a single pulse source in the unit under test 151 is to be measured and adjusted, the automatic test equipment then performs the operation shown in FIG. 4. If a multiple pulse source, such as measured voltage controlled oscillator 155 is to be measured or adjusted, then the automatic test equipment performs the operation shown in FIG. 5.

Single Pulse Adjustment Phase

Figure 3:
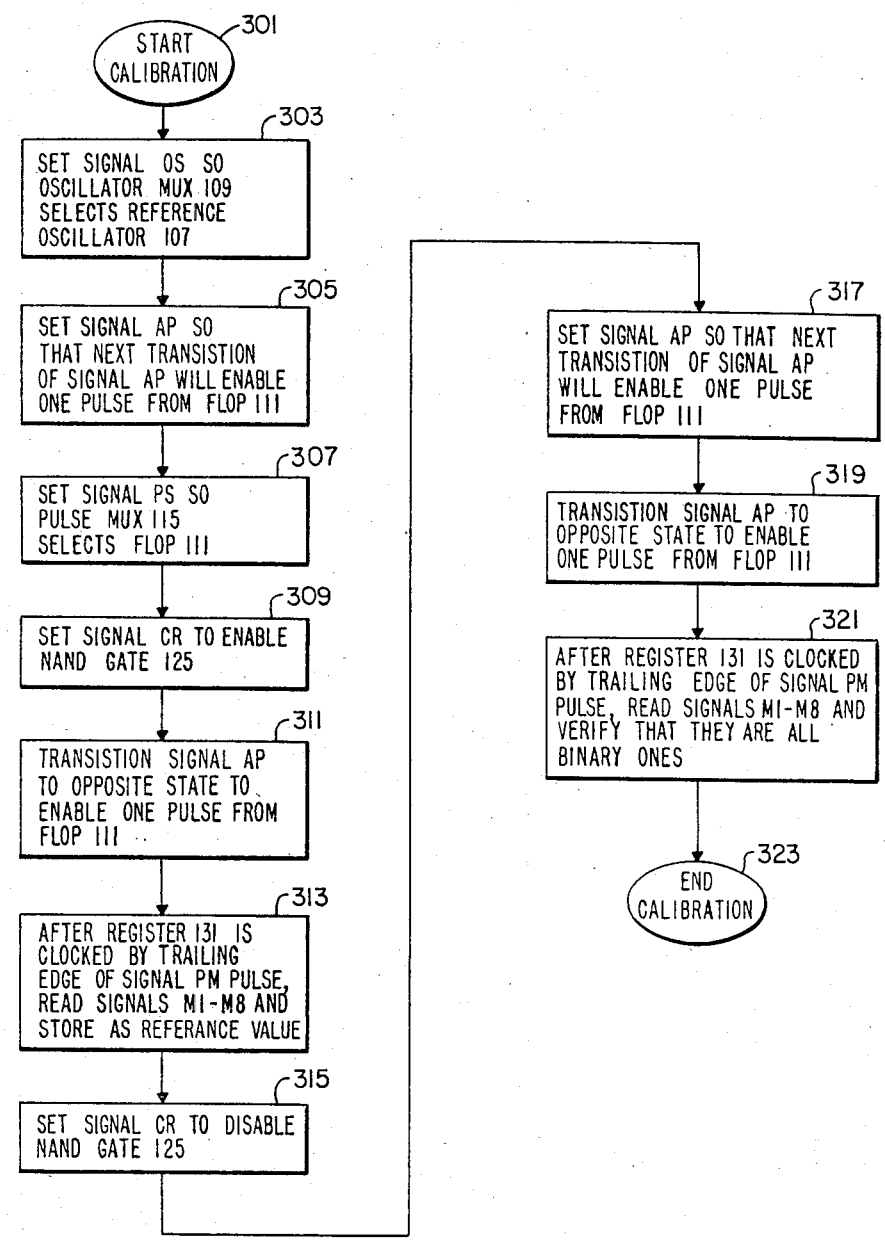
FIG. 3 is a general flow chart of a calibration operation of the frequency or time measurement circuit.
Figure 4:
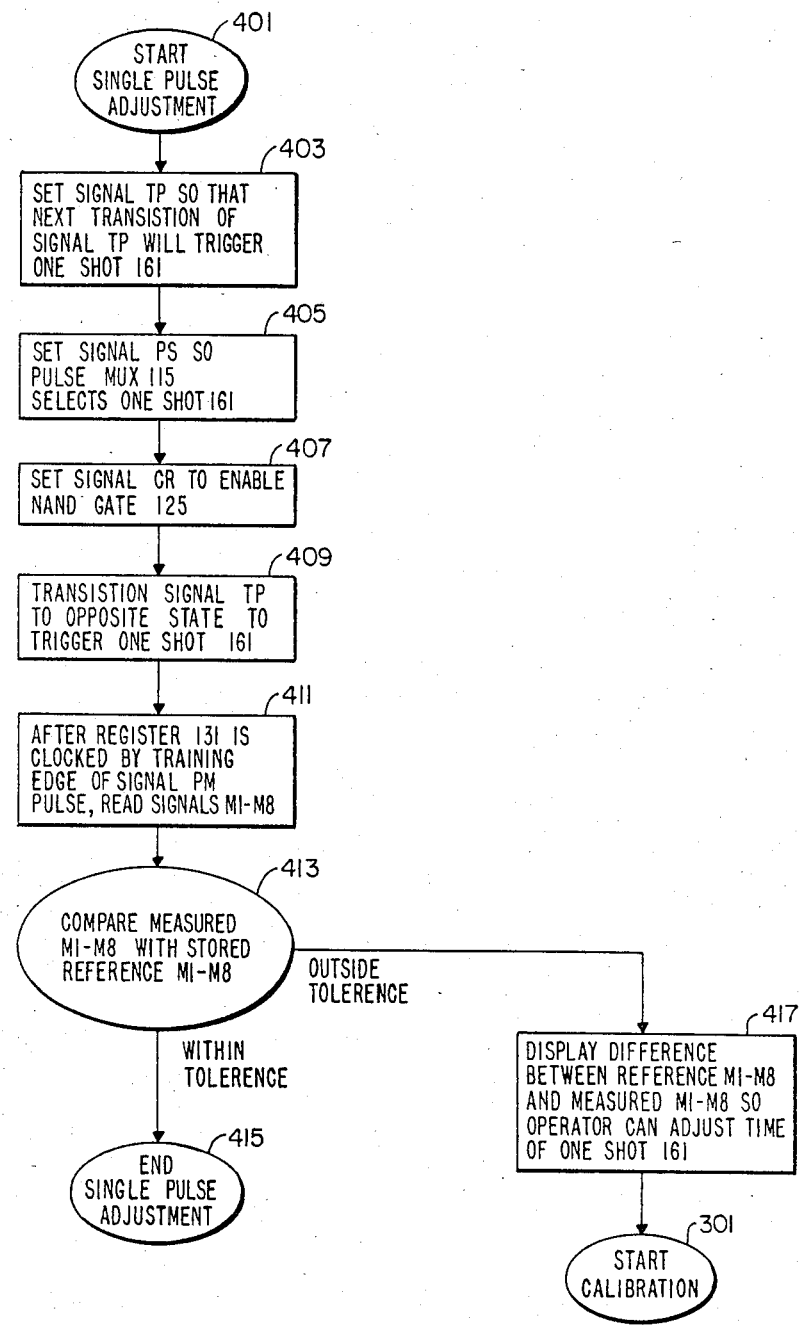
FIG. 4 is a general flow diagram of a single pulse adjustment operation used to adjust the measured one shot of FIG. 1.

In FIG. 4, the single pulse adjustment phase of the operation phase is begun by entering block 401 after having executed the calibration phase of FIG. 3. In block 403, signal TP is set to the binary ZERO state to that when it next transitions to the binary ONE state it will trigger measured one shot 161. In block 405, signal PS is set to the binary ZERO state so that pulse multiplexer 115 will gate signal MP to its Q output as signal PM on line 124. In block 407, signal CR is set to the binary ONE state to enable NAND gate 125 so that the output of block delay one shot 119 can propagate through segmented delay multitap delay line 127 as signal DP.

In block 409, signal TP is transitioned from the binary ZERO to the binary ONE state to trigger one shot 161. In FIG. 2, this is shown from signal MP transitioning from the binary ZERO state to the binary ONE state at time C, which causes a corresponding change in the output of pulse multiplexer 115, signal PM, to occur at the same time. At time I, the output of measured one shot 161, signal MP, will transition from the binary ONE to the binary ZERO state as determined by the delay period within measured one shot 161 which is shown by the dash line between the rising edge of signal MP at time C and the falling edge of signal MP at time I in FIG. 2. Thus, in FIG. 2 the first signal of interest during the single pulse adjustment phase is signal MP and the other signals, RO, MO, OM, AP, PA, PO and OP, do not affect the operation of the measurement circuit 103 during the single pulse adjustment phase operation, except that signal AP must be controlled so as not to transition from the binary ZERO to the binary ONE state.

In block 411, after register 131 has been clocked by the trailing edge of the signal PM pulse, which transitions from the binary ZERO to the binary ONE state at time I, causing signal PI to transition from the binary ONE to the binary ZERO state and clock register 131, the Q0 through Q7 outputs of register 131 are read as signals M1 through M8. In block 413, the measured values of signals M1 through M8 are compared with the store reference values of M1 through M8 and a determination is made as to whether the measured value is within tolerance of the stored value. If the measured value is within tolerance of the stored value, block 413 exits to block 415 and the single pulse adjustment operation is completed. If the measured M1 through M8 is not within tolerance of the stored reference M8 throgh M1, then block 413 exits to block 417.

The determination as to whether or not the measured value is within tolerance of the reference value is done by examining the difference between the measured M1 through M8 signals and the stored reference M1 through M8 signals. For example, if the stored reference reading has signals M1 through M4 as binary ONEs and signals M5 through M8 as binary ZEROs as illustrated in FIG. 2 and the measured reading has signals M1 through M5 as binary ONEs and signals M6 through M8 as binary ZEROs, this indicates that the measured time is essentially within two times the granularity between signal taps T4 and T5 of segmented delay multitap delay line 127 (assuming equal time spacing between taps). In the example, this is five nanoseconds which therefore means that the measured reading is within approximately 10 nanoseconds of the reference reading. If the measured reading is not within tolerance of the reference reading and block 417 is entered, the automatic test equipment then displays the difference between the reference reading and the measured reading in terms that allow an operator to adjust the time delay of the single pulse source. In this case, it means adjustment of variable resistor 165. Rather than display the difference in readings between the reference and the measured values, block 417 could automatically adjust the time delay by use of an automatic screwdriver to adjust a variable resistor. If a manual adjustment of the single pulse source is performed on the unit under test 151, then block 417 may or may not wait for the operator to indicate that the adjustment has taken place before exiting to block 301 which performs another calibration operation which is then immediately followed by a single pulse adjustment operation to see whether the adjustment of the single pulse source frequency or time period has been successful. This calibration operation followed by a measurement operation followed by an adjustment is continued until such time as the single pulse source is found to be within tolerance and the exit to block 415 is taken or until such time as the maximum number of adjustment tries has been exhausted or until the time allotted for the adjustment has expired.

Oscillator Adjustment Phase

Figure 5:
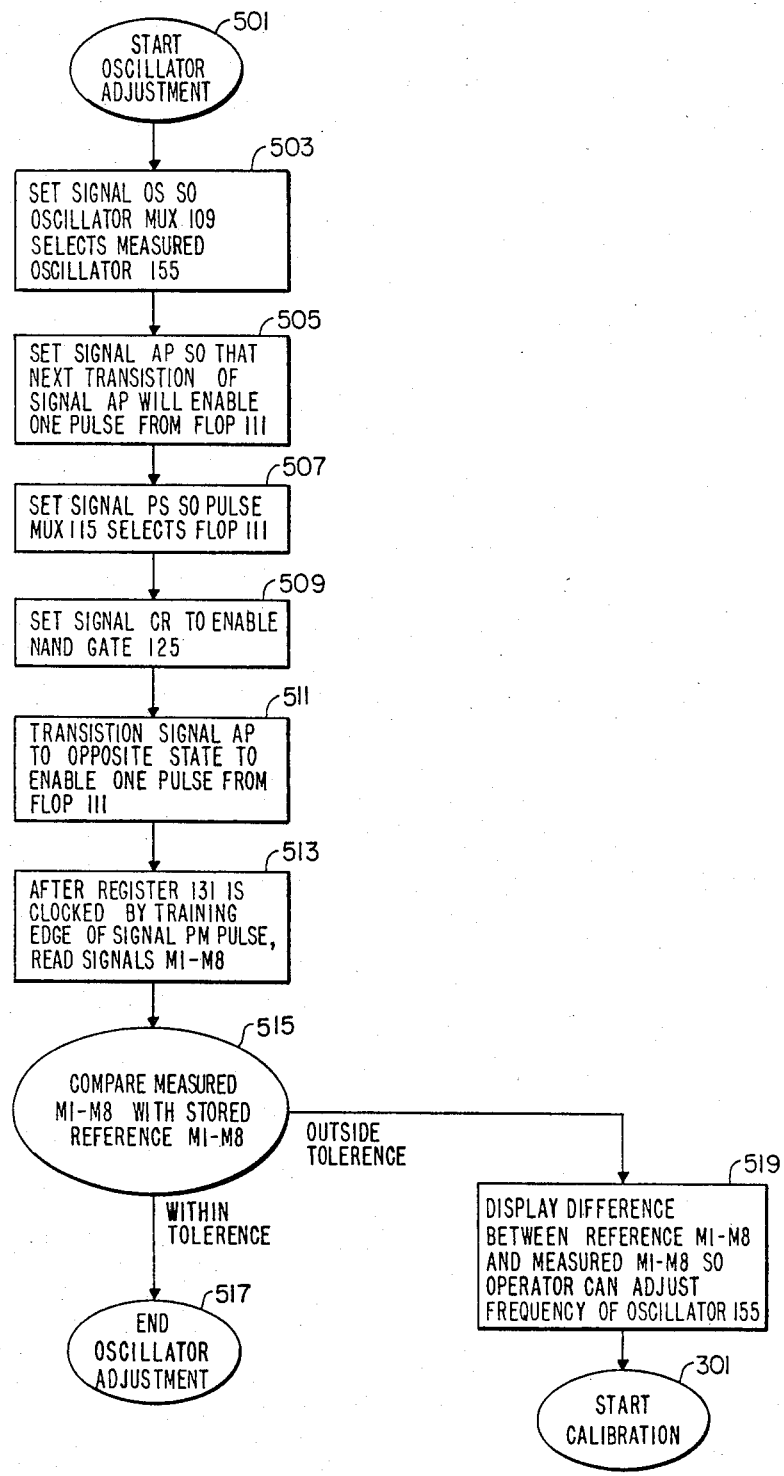
FIG. 5 is a general flow diagram of an oscillator adjustment operation used to adjust the measured oscillator of FIG. 1.

FIG. 5 illustrates the flow chart of the operation which is performed when a multipulse source such as a voltage controlled oscillator within the unit under test 151 is to be adjusted. Block 501 is the start of the operation which is begun after the calibration operation of FIG. 3 is completed. In block 503, signal OS is set to a binary ZERO so that signall MO on line 106 at one input of oscillator multiplexer 109 will be gated onto the Q output thereof so that signal OM on line 108 will follow signal MO on line 106. In block 505, signal AP is set to the binary ZERO state so that when it transitions to the binary ONE state pulse flop 111 and pulse flop 113 will enable one pulse to appear on line OP as a positive going pulse. This pulse will begin in response to one binary ZERO to binary ONE transition on line 106 and end in response to the next binary ZERO to binary ONE transition on line 106. The period of this pulse, then, is essentially the same as the time between positive transitions of signal MO on line 106, which time is equal to the reciprocal of the frequency of measured oscillator 155. Block 507 sets signal PS to the binary ONE state so that pulse multiplexer 115 selects signal OP on line 116 to be gated to the Q output thereof so that signal PM on line 124 will follow signal OP on line 116. Block 509 is then entered and signal CR is set to the binary ONE state to enable NAND gate 125 so that the output thereof, signal DP on line 130, will be controlled by signal PD on line 128. In block 511, signal AP is transitioned from the binary ZERO state to the binary ONE state thus enabling one pulse of a period equal to approximately the time between positive transitions of signal MO from measured voltage controlled oscillator 155 to control the output on line 116 as signal OP.

In FIG. 2, this transition of signal AP from the binary ZERO to the binary ONE state at time B is shown as causing signal PA to transition from the binary ZERO to the binary ONE state at time B and to transition from the binary ONE state to the binary ZERO state at time C in response to signal MO and OM transitioning from the binary ZERO to the binary ONE state at time C which in turn causes signal PO to transition from the binary ONE to the binary ZERO state also at time C. Thus, at time C the first rising edge of signal MO from measured voltage controlled oscillator 155 which occurs after pulse flop 111 and 113 have been enabled by signal AP transitioning from the binary ZERO to the binary ONE state at time B, causes the output of pulse flop 111, signal OP and the output of pulse multiplexer 115, signal MP, to transition from the binary ZERO to the binary ONE state, which is the leading edge of the single pulse whose duration will be compared with the length of the reference pulse that was generated during the calibration phase. This leading edge of signal PM at time C triggers block delay one shot 119 and causes its output, signal PD, to transition from the binary ZERO state to the binary ONE state at time C and to transition from the binary ONE to the binary ZERO state after the delay associated with block delay one shot 119 at time G.

Signal PD is effectively inverted by NAND gate 125 causing signal DP to transition from the binary ZERO to the binary ONE state at time G. This transition of signal DP from the binary ZERO to the binary ONE state at time G constitutes the trailing edge of the single pulse of signal DP which travels through segmented delay multitap delay line 127. At time H1, signal T1 transitions from the binary ZERO to the binary ONE state, at time H2, signal T2 at the third tap of segmented delay multitap delay line transitions from the binary ZERO to the binary ONE state, at time H3, signal T3 transitions from the binary ZERO to the binary ONE state and at time H4, signal T4 transitions from the binary ZERO to the binary ONE state. At time I, the second transitions of signals MO and OM from the binary ZERO to the binary ONE state result in the clocking of pulse flop 111 which results in its output signals PO transitioning from the binary ZERO to the binary ONE state and its other, signal OP, transitioning from the binary ONE to the binary ZERO state. The transition of signal OP from the binary ONE to the binary ZERO state results in the transition of signal PM from the binary ONE state to the binary ZERO state at the output of pulse multiplexer 115 which in turn results in the output of inverter 117 transitioning from the binary ZERO to the binary ONE state also at time I. This transition of signal PI from the binary ZERO to the binary ONE state results in the clocking of register 131 which will clock the current state of signals T1 through T8 onto its outputs as signals M1 through M8. Because at time I, signals T1 through T4 are currently in the binary ONE state and signals T5 through T8 are in the binary ZERO state, the clocking of register 131 will result its output signals, M1 through M4 remaining in the binary ONE state and will result in the output signals, M5 through M8, going to the binary ZERO state. At time J1, the trailing edge of pulse DP will have progressed to the sixth tap on segmented delay multitap delay line 127, signal T5 transitions from the binary ZERO to the binary ONE state as does signal T6 at time J2, signal T7 at time J3 and signal T8 at time J4. These transitions of signals T5 through T8 will occur after the clocking of register 131 and therefore will not result in the signals M5 through M8 assuming the binary ONE state.

In block 513, after register 131 has been clocked by the trailing edge of signal PM, the signals M1 through M8 are read by the automatic test equipment 101. In block 515 a comparison is made between the state of the just measured M1 through M8 signals and this is compared with the stored reference M1 through M8 signals stored when the measurement circuit 103 was calibrated. Block 515 exits to block 517 if the measured M1 through M8 signals are within the tolerance of the reference M1 through M8 signals. In block 517, the oscillator adjustment phase is completed. If the measured M1 through M8 signals are not within tolerance of the reference M1 through M8 signals, block 515 exits to block 519 which displays the difference between the reference M1 through M8 and the measured M1 through M8 signals so that an operator can adjust the frequency of measured voltage controlled oscillator 115 by adjusting the potentiometer 157. As indicated above, rather than having this adjustment be performed manually by an operator in response to directions from the automatic test equipment, the automatic test equipment could directly control the adjustment of the potentiometer 157 by an automatic screwdriver or some other means. Block 519 then exits to block 301 which goes back and recalibrates measurement circuit 103 before performing a subsequent oscillator adjustment phase to see whether the adjustment of measured voltage controlled oscillator 155 brought it within the tolerance of the reference frequency.

From the above discussion it can be appreciated that the basis of the frequency or time measurement circuit 103 is to use a stable reference pulse to provide a reference reading which is obtained by using the trailing edge of the pulse to capture how far in effect the delayed leading edge of the reference pulse has progressed through a multiple tap delay line by clocking a register and storing this reading as a reference reading and then using the trailing edge of the single pulse to be measured to again clock the same register and capture how far the leading edge of the single pulse has progressed through the multiple tap delay line and comparing the two readings to determine whether the measured pulse is of longer or shorter duration than the reference calibration pulse. As will also be appreciated, the time delays associated with block delay one shot 119, segmented delay multitap delay line 127, inverter 117 and register 131 must be relatively constant between the calibration phase and the measurement phase, although they may drift over a long time period, so that the differences between the calibration reading and the measurement reading are due primarily to the difference between the reference pulse and the measured pulse. This short term consistency is achieved by having the measurement phase immediately follow the calibration phase such that the characteristics of the various components will be the same for both readings. It is this short time between the calibration reading and the measurement reading that permits the block delay function of the circuit to be performed by one shot 119 because its characteristics will not change significantly between the two readings whereas a crystal controlled oscillator and pulse flops 111 and 113 are used to provide the reference pulse instead of a one shot so that the long term stability of the reference pulse can be assured.

Although the above discussion has been in terms of having the measurement phase follow the calibration phase, the order of the two phases could be reversed. If the measurement reading is taken before the calibration reading, it may be desirable to set register 131 to a known state before the measurement reading by use of NAND gate 125 so as to permit the detection of missing measured one shot 161 on measured voltage controlled oscillator 155 which could result in the nonclocking of register 131 during the measurement phase.

Although the discussion of the preferred embodiment shown in FIG. 1 has been in terms of taking a snapshot of the progression through segmented delay multitap delay line 127 of the trailing edge of the pulse generated by block delay one shot 119 which is triggered by the leading edge of the pulse of signal PM on line 124, it will be appreciated that using the trailing edge of the pulse from one shot 119 is equivalent to using the leading edge of the pulse from signal PM delayed for the period of one shot 119 and with the sense of the transition between binary states reversed. Therefore, block delay one shot 119 can be thought of as simply delaying the leading edge of the pulse of signal PM and register 131 as capturing the progress of the leading edge through delay line 127. Block delay one shot 119 could be replaced by a delay line having an equal delay period. The advantage of using a one shot is that the delay period of a one shot is easily adjusted which permits an initial adjustment to have the trailing edge of the pulse fall on the middle tap of segmented delay multitap delay line 127 during the calibration phase.

From the above discussion it will be appreciated that the measurement circuit is sufficiently small in size and low in cost that it can be placed with the bed-of-nails test fixture of an automatic test equipment with a different measurement circuit being provided for each bed-of-nails test fixture so that a customized measurement circuit having a preset reference oscillator can be used for the particular printed circuit board to be tested. Because the reference oscillator 107 is crystal controlled, once block delay one shot 119 is adjusted to produce a pulse somewhat shorter than the reference pulse derived from reference oscillator 107, the measurement circuit can be used over a long period without readjustment because it is calibrated just before a measure reading is taken.

A particular embodiment of the invention has been described with reference to FIG. 1 but there are many alterations to this circuit which can be made which employ the principle of the invention. If only single pulse sources are to be measured, oscillator multiplexer 109 could be eliminated by having signal RO from line 104 clock pulse flop 111. If single pulse sources having a variety of time periods are to be measured or if multiple pulse sources having a variety of frequencies are to be measured, oscillator multiplexer 109 could be expanded to have more inputs allowing for the selection of a variety of reference oscillators, each oscillator being matched to a particular frequency or time period to be measured. If single pulse sources are not to be measured and only multiple pulse sources are to be measured, pulse multiplexer 115 could be eliminated and the output of pulse flop 111, signal OP on line 116, could directly feed block delay one shot 119 and inverter 117.

If the measurement circuit is to be used to measure widely different frequencies or time periods and multiple reference oscillators 107 are used with the appropriate reference oscillator being selected by oscillator multiplexer 109, then, a corresponding number of block delay one shots 119 will be required with the output of the appropriate block delay one shot being selected by an additional multiplexer between the block delay one shots 119 and NAND gate 125. Also reference oscillator 107 could be replaced with a frequency synthesizer and it could be controlled by automatic test equipment 101.

There are other circuits which could be used in place of pulse flops 111 and 113 to provide for a single pulse to be generated on line OP. Alternatively, the single pulse limiting function of pulse flops 111 and 113 could be eliminated by removing them and providing for the dynamic clocking of register 131 at the frequency of reference oscillator 107 or measured voltage controlled oscillator 155 which oscillator is controlling the output of oscillator multiplexer 109 so that register 131 would be clocked dynamically on each oscillator cycle. This dynamic clocking of register 131 has the disadvantage that its outputs may not be stable at the time they are read by automatic test equipment 101 and false readings could result unless a means is provided to assure that register 131 outputs are stable when read.

A still further change could be made in which the single pulse limiting function performed by pulse flop 111 and pulse flop 113 is preceded by a divide function such that if the frequency of either reference oscillator 107 or measured voltage controlled oscillator 155 would be divided by some multiple and any small variations in the frequency of the oscillator would be averaged out over the multiple cycles. For example, if the single pulse limiting function performed by pulse flop 111 and pulse flop 113 in the preferred embodiment also resulted in the frequency of the oscillator being divided by four, then a four megahertz reference oscillator 107 would be used in place of the one megahertz oscillator and the output of the single pulse of signal OP on line 116 would be still a one microsecond pulse but it would be averaged over four cycles from reference oscillator 107 or measured voltage controlled oscillator 155.

Block delay one shot 119 and segmented delay multitap delay line 127 could be replaced by a series of delay lines or one shots with taps into register 131 being taken between the delay lines or one shots or a single delay line having multiple taps so long as the granularity between successive taps was sufficiently fine to allow adjustment or measurement within the desired tolerance and so long as the middle tap that is read into register 131 is approximately at the time period or frequency of the desired calibration reference.

Although the preferred embodiment has been described in terms of having the taps of segmented delay multitap delay line 127 as uniformly spaced, non-uniformly spaced taps could also be used. It may be desirable to have them spaced with grosser division as the extremes and finer divisions as the middle to that greater output of adjustment readings would still fall within register 131 but still retain the fine granularity around the desired reference value. Further, it will be appreciated that the adjustment program can be written to tolerate differences between the reference reading and the measurement reading and not require equal readings.

NAND gate 125 can be eliminated if some other means of resetting register 131 between a calibration reading and a measurement reading is provided so that it can be guaranteed that when the measurement reading is made it is not a leftover calibration reading because no pulse has occurred to clock register 131, which may be the case if the component being measured on the unit under test 151 is entirely absent such that it does not cause any transition of signal PM which will clock register 131 and capture a measurement reading.

Although the preferred embodiment has been described in terms of using the measurement circuit in conjunction with automatic test equipment, it will be appreciated that the circuit could be used as part of a stand alone instrument in which the control signals are generated by the instrument itself and in which the comparison between the calibration reading and the measurement reading are performed by the instrument and then displayed or otherwise made available.

While the invention has been shown and described with reference to the preferred embodiment thereof, it will be understood by those skilled in the art that the above and other changes in form and detail may be made therein without deparing from the spirit and scope of the invention.

What is claimed is:

1. Apparatus for measuring the time period of a single pulse signal comprising:
   A. a reference pulse source for generating a reference pulse signal;
   B. a selector means having a first input coupled to receive said single pulse signal and a second input coupled to receive said reference pulse signal, said selector means for providing said single pulse or said reference pulse at an output;
   C. a delay means for delaying an input signal, said delay means having an input coupled to said output of said selector means, said delay means having a plurality of outputs spaced at a plurality of delay periods relative to said input; and
   D. a reading means having a clock input coupled to said output of said selector means and a plurality of data inputs coupled to said plurality of outputs of said delay means, said reading means for taking an instantaneous reading of said plurality of outputs of said delay means in response to a clocking signal at said clock input, whereby the time period of said single pulse signal can be determined by taking a reference reading using said reference pulse signal and a measurement reading using said single pulse signal and comparing said reference reading with said measurement reading and calculating the difference based on the relationship between said delay periods of said plurality of outputs of said delay means.

2. The apparatus of claim 1 wherein said reference pulse source comprises an oscillator and a single pulse logic which generates a single pulse having a leading edge and a trailing edge in response to one or more complete cycles of an output signal of said oscillator.

3. The apparatus of claim 2 wherein said oscillator is a crystal controlled oscillator and said single pulse logic comprises two flip-flops.

4. The apparatus of claim 1 wherein said reading means comprises a register having a clock input, a plurality of data inputs and a corresponding plurality of data outputs.

5. The apparatus of claim 4 wherein said reading means further comprises an inverter having an input coupled to said output of said selector means and an output coupled to said clock input of said register.

6. The apparatus of claim 1 wherein said selector means comprised a multiplexer.

7. The apparatus of claim 1 wherein said delay means comprises a one shot and a multitap delay line.

8. The apparatus of claim 7 wherein said delay means further comprises a NAND gate having a first input coupled to an output of said one shot and an output coupled to an input to said multitap delay line and wherein a second input of said NAND gate is coupled to receive a control signal for controlling the state of signals at said plurality of data outputs of said delay means thereby providing for the setting of said reading means to a predetermined state.

9. Apparatus for measuring the frequency or time period of a multiple pulse signal comprising:
   A. a reference oscillator for generating a reference oscillating signal;
   B. a selector means having a first input coupled to receive said multiple pulse signal and a second input coupled to receive said reference oscillating signal, said selector means for providing said multiple pulse signal or said reference oscillating signal at an output;
   C. a single pulse logic which generates a single pulse having a leading edge and a trailing edge in response to one complete cycle of an oscillating input signal;
   D. a delay means for delaying an input signal, said delay means having an input coupled to said output of said selector means, said delay means having a plurality of outputs spaced at a plurality of delay periods relative to said input; and
   E. a reading means having a clock input coupled to said output of said selector means and a plurality of data inputs coupled to said plurality of outputs of said delay means, said reading means for taking an instantaneous reading of said plurality of outputs of said delay means in response to a clocking signal at said clock input, whereby the relative frequency or time period of said multiple pulse signal can be determined by taking a reference reading using said reference oscillating signal and a measurement reading using said multiple pulse signal and comparing said reference reading with said measurement reading and calculating the difference based on the relationship between said delay periods of said plurality of outputs of said delay means.

10. The apparatus of claim 9 wherein said reference oscillator is a crystal controlled oscillator and said single pulse logic comprises two flip-flops.

11. The apparatus of claim 9 wherein said reading means comprises a register having a clock input, a plurality of data inputs and a corresponding plurality of data outputs.

12. The apparatus of claim 11 wherein said reading means further comprises an inverter having an input coupled to said output of said selector means and an output coupled to said clock input of said register.

13. The apparatus of claim 9 wherein said selector means comprised a multiplexer.

14. The apparatus of claim 9 wherein said delay means comprises a one shot and a multitap delay line.

15. The apparatus of claim 14 wherein said delay means further comprises a NAND gate having a first input coupled to an output of said one shot and an output coupled to an input to said multitap delay line and wherein a second input of said NAND gate is coupled to receive a control signal for controlling the state of signals at said plurality of data outputs of said delay means thereby providing for the setting of said reading means to a predetermined state.

16. Apparatus for measuring the time period of a single pulse signal or frequency or time period of a multiple pulse signal comprising:
   A. a reference oscillator for generating a reference oscillating signal;
   B. a first selector means having a first input coupled to receive said multiple pulse signal and a second input coupled to receive said reference oscillating signal, said selector means for providing said multiple pulse signal or said reference oscillating signal at an output;
   C. a single pulse logic which generates an one pulse signal having a leading edge and a trailing edge in response to one or more complete cycles of an oscillating input signal;
   D. a second selector means having a first input coupled to receive said single pulse signal and a second input coupled to receive said single pulse reference signal, said selector means for providing said single pulse signal or said single reference pulse signal at an output;
   E. a delay means for delaying an input signal, said delay means having an input coupled to said output of said second selector means, said delay means having a plurality of outputs spaced at a plurality of delay periods relative to said input; and
   F. a reading means having a clock input coupled to said output of said selector means and a plurality of data inputs coupled to said plurality of outputs of said delay means, said reading means for taking an instantaneous reading of said plurality of outputs of said delay means in response to a clocking signal at said clock input, whereby the time period of said single pulse signal or the relative frequency or time period of said multiple pulse signal can be determined by taking a reference reading using said single pulse reference signal and a measurement reading using said one pulse signal and comparing said reference reading with said measurement reading and calculating the difference based on the relationship between said delay periods of said plurality of outputs of said delay means.

17. The apparatus of claim 16 wherein said reference oscillator is a crystal controlled oscillator and said single pulse logic comprises two flip-flops.

18. The apparatus of claim 16 wherein said reading means comprises a register having a clock input, a plurality of data inputs and a corresponding plurality of data outputs.

19. The apparatus of claim 16 wherein said reading means further comprises an inverter having an input coupled to said output of said selector means and an output coupled to said clock input of said register.

20. The apparatus of claim 16 wherein said first selector means comprises a first multiplexer and said second selector means comprises a second multiplexer.

21. The apparatus of claim 16 wherein said delay means comprises a one shot and a multitap delay line.

22. A method of measuring the frequency or time period of an unknown pulse having a leading edge and a trailing edge comprising the steps of:
  A. performing a calibration phase in which a reference pulse is delayed by a delay means and a reading taken of the progress of said reference pulse through said delay means upon the detection of a trailing edge of said reference pulse;
  B. performing a measurement phase in which said unknown pulse is delayed by said delay means and a reading is taken of the progress of said unknown pulse through said delay means upon the detection of said trailing edge of said unknown pulse; and
  C. determining said time period by calculating the difference between said reading of said reference pulse and said reading of said unknown pulse.

23. The method of claim 22 wherein between said calibration phase and said measurement phase, a register used to take said readings is set to a known state so that said reading of said reference pulse does not remain in said register and the failure of said trailing edge of said unknown pulse to occur can be detected.

24. The method of claim 22 wherein said reference pulse is produced by using an oscillator and single pulse logic which generates a leading edge of said reference pulse upon the detection of a beginning of an oscillator signal cycle and generates said trailing edge of said reference pulse upon the detection of the beginning of a next oscillator signal cycle.

25. The method of claim 22 wherein said unknown pulse is produced by an oscillator whose frequency or time period is to be measured and by a single pulse logic which generates said leading edge of said unknown pulse upon the detection of a beginning of said oscillator signal cycle and generates said trailing edge of said unknown pulse upon the detection of the beginning of a next oscillator signal cycle.

26. A method of measuring the frequency or time period of an unknown multiple pulse signal having a succession of leading edges and a trailing edges comprising the steps of:
  A. performing a calibration phase in which a single reference pulse is delayed by a delay means and a reading taken of the progress of said reference pulse through said delay means upon the detection of a trailing edge of said reference pulse;
  B. performing a measurement phase in which a single unknown pulse is delayed by said delay means and a reading is taken of the progress of said unknown pulse through said delay means upon the detection of said trailing edge of said unknown pulse; and
  C. determining said time period by calculating the difference between said reading of said single reference pulse and said reading of said single unknown pulse.

27. The method of claim 26 wherein said single reference pulse is produced by single pulse logic which generates a leading edge of said single reference pulse upon the detection of a beginning of an oscillator signal cycle and generates said trailing edge of said single reference pulse upon the detection of the beginning of a next oscillator signal cycle.

28. The method of claim 26 wherein said single unknown pulse is produced by a single pulse logic which generates said leading edge of said single unknown pulse upon the detection of a beginning of said oscillator signal cycle and generates said trailing edge of said single unknown pulse upon the detection of the beginning of a next oscillator signal cycle.

* * * * *

UNITED STATES PATENT AND TRADEMARK OFFICE
CERTIFICATE OF CORRECTION

PATENT NO. : 4,603,292

DATED : July 29, 1986

INVENTOR(S) : Robert J. Russell

It is certified that error appears in the above-identified patent and that said Letters Patent are hereby corrected as shown below:

Title Page item [56]:

"Attorney, Agent or Firm" section has been omitted.
Please enter this section showing the following attorneys.

George Grayson
John S. Solakian
(William A. Linnell)

Signed and Sealed this

Eleventh Day of November, 1986

Attest:

DONALD J. QUIGG

Attesting Officer

Commissioner of Patents and Trademarks